(12) United States Patent
Yao et al.

(10) Patent No.: US 10,955,948 B2
(45) Date of Patent: Mar. 23, 2021

(54) TOUCH DISPLAY PANEL AND TOUCH DISPLAY DEVICE

(71) Applicant: Shanghai Tianma Micro-Electronics Co., Ltd., Shanghai (CN)

(72) Inventors: Qijun Yao, Shanghai (CN); Hong Ding, Shanghai (CN); Lingxiao Du, Shanghai (CN); Liang Xie, Shanghai (CN)

(73) Assignee: SHANGHAI TIANMA MICRO-ELECTRONICS CO., LTD., Shanghai (CN)

(*) Notice: Subject to any disclaimer, the term of this patent is extended or adjusted under 35 U.S.C. 154(b) by 78 days.

(21) Appl. No.: 16/230,828

(22) Filed: Dec. 21, 2018

(65) Prior Publication Data

US 2019/0369784 A1 Dec. 5, 2019

(30) Foreign Application Priority Data

May 31, 2018 (CN) .......................... 201810552991.2

(51) Int. Cl.
*G06F 3/041* (2006.01)
*H01L 27/32* (2006.01)
*G06F 3/044* (2006.01)

(52) U.S. Cl.
CPC ............ *G06F 3/0412* (2013.01); *G06F 3/044* (2013.01); *H01L 27/323* (2013.01); *H01L 27/3211* (2013.01); *H01L 27/3246* (2013.01); *G06F 2203/04112* (2013.01)

(58) Field of Classification Search
CPC .................. G06F 3/0412; G06F 3/044; G06F 2203/04112; H01L 27/3211; H01L 27/323; H01L 27/3246
See application file for complete search history.

(56) References Cited

U.S. PATENT DOCUMENTS

| | | | | |
|---|---|---|---|---|
| 4,926,235 | A | * | 5/1990 | Tamaki ............. H01L 21/28525 257/518 |
| 5,497,346 | A | * | 3/1996 | Egawa ..................... G11C 8/18 365/189.011 |
| 9,904,423 | B2 | * | 2/2018 | Lin ........................ G06F 3/0443 |
| 2016/0041667 | A1 | | 2/2016 | Lai et al. |
| 2016/0218158 | A1 | | 7/2016 | Li et al. |

(Continued)

FOREIGN PATENT DOCUMENTS

| CN | 102999219 A | 3/2013 |
|---|---|---|
| CN | 104576704 A | 4/2015 |

(Continued)

*Primary Examiner* — Antonio Xavier
(74) *Attorney, Agent, or Firm* — Alston & Bird LLP

(57) ABSTRACT

A touch display panel and a touch display device are provided. The touch display panel includes: a substrate, a light-emitting device layer arranged on the substrate, and multiple touch electrodes arranged on the side of the light-emitting device layer away from the substrate. The light-emitting device layer includes multiple pixels, and each of the pixels has a light-emitting region and a non-light-emitting region on the periphery of the light-emitting region. Each of the touch electrodes has a structure of a metal grid. The pixels include first color pixels, and grid lines of the metal grid are arranged in each of the non-light-emitting regions of at least a part of the first color pixels.

20 Claims, 11 Drawing Sheets

(56) References Cited

U.S. PATENT DOCUMENTS

| | | | |
|---|---|---|---|
| 2017/0090664 A1 | 3/2017 | Zheng et al. | |
| 2018/0011385 A1* | 1/2018 | Kang et al. | |
| 2018/0039360 A1* | 2/2018 | Akimoto | H01L 51/5218 |
| 2018/0046301 A1 | 2/2018 | Zhou et al. | |
| 2018/0188837 A1* | 7/2018 | Son | G06F 3/0412 |
| 2019/0179466 A1* | 6/2019 | Kim | G06F 3/0412 |
| 2020/0082142 A1 | 3/2020 | Ye | |

FOREIGN PATENT DOCUMENTS

| | | |
|---|---|---|
| CN | 105334994 A | 2/2016 |
| CN | 106055170 A | 10/2016 |
| CN | 106959780 A | 7/2017 |
| CN | 106816455 A | 9/2017 |
| CN | 107122077 A | 9/2017 |
| CN | 107689386 A | 2/2018 |
| CN | 107946346 A | 4/2018 |

* cited by examiner

TOUCH DISPLAY PANEL AND TOUCH DISPLAY DEVICE

CROSS REFERENCE OF RELATED APPLICATION

The present application claims priority to Chinese Patent Application No. CN201810552991.2, titled "TOUCH DISPLAY PANEL AND TOUCH DISPLAY DEVICE", filed on May 31, 2018 with the Chinese Patent Office, which is incorporated herein by reference in its entirety.

FIELD

The present disclosure relates to the technical field of display, and in particular to a touch display panel and a touch display device.

BACKGROUND

Most information to a human is accepted by the visual organs (eyes) of a human. Since more visual information is required by people in production and life, the display technology is very important in the current human life. The display technology is developed very rapidly, from cathode ray tube (CRT) technology, plasma display panel (PDP) technology, liquid crystal display (LCD) technology, to the latest organic light-emitting diode (OLED) display technology and micro light-emitting diode (LED) display technology which are developed sequentially.

With the improvement of society and the increasing demand of people for technology, the current display technology is favoring narrow rim, high contrast, high resolution, full color display, low power consumption, high reliability, long lifetime and thinness and lightness. The organic light-emitting display technology has been constantly advancing and its research has been deepening. A touch function is realized in the organic light-emitting display panel in the conventional technology. A research issue in the display industry is to improve display effect of the organic light-emitting display panel.

SUMMARY

In view of this, a touch display panel and a touch display device are provided in the present disclosure.

The touch display panel provided in the present disclosure includes: a substrate, a light-emitting device layer arranged on the substrate, and multiple touch electrodes arranged on a side of the light-emitting device layer away from the substrate. The light-emitting device layer includes multiple pixels, and each of the multiple pixels has a light-emitting region and a non-light-emitting region on the periphery of the light-emitting region. Each of the multiple touch electrodes has a structure of a metal grid. The pixels include first color pixels, and grid lines of the metal grid are arranged in each of the non-light-emitting regions of at least a part of one of the first color pixels. The distance between a boundary of the light-emitting region of said first color pixel and an edge of a close-by touch electrode is defined as a first boundary distance d1 of said first color pixel, wherein $1\ \mu m \leq d1 \leq 20\ \mu m$.

The touch display device provided in the present disclosure includes the touch display panel provided in the present disclosure.

As compared with the conventional technology, the touch display panel and the touch display device provided in the present disclosure realize at least the following advantageous effects.

The first boundary distances of the first color pixels are set to be equal with each other, so that when a person looks at the display panel in different directions, the seen light-emitting regions of the first color pixels have the same size, thereby reducing a difference in a display screen, suppressing color shift, solving a problem of a visible touch pattern in the touch display panel, and improving a display effect. Further, in the touch display panel and the touch display device in the present disclosure, the touch display panel can have a high aperture ratio, thereby improving resolution of the display panel, and achieving high pixel per inch (PPI) of the product and improving user experience.

In practice, any product implemented with the present disclosure does not necessarily realize all of the technical effects described above.

BRIEF DESCRIPTION OF THE DRAWINGS

The exemplary embodiments of the present disclosure are described in detail below with reference to the drawings, so that other features and advantages of the present disclosure become clear.

The drawings incorporated in the specification and forming a part of the specification show the embodiments of the present disclosure, to explain principles of the present disclosure together with the description thereof.

DETAILED DESCRIPTION OF EMBODIMENTS

Figure 1:
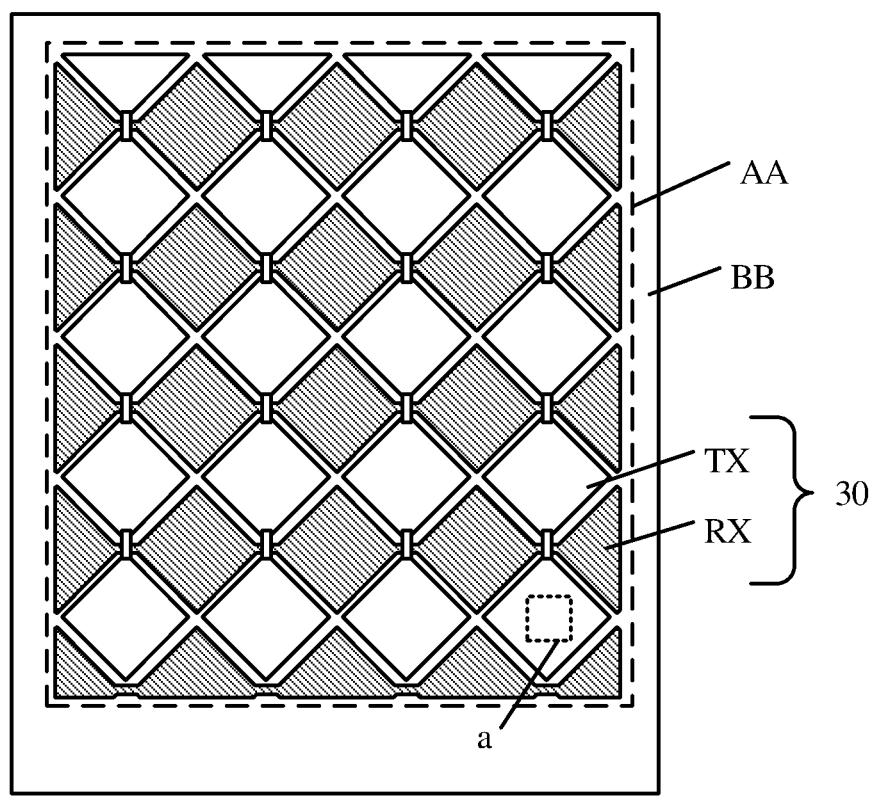
FIG. 1 is a schematic planar structural diagram of a touch display panel according to an embodiment of the present disclosure.

Various exemplary embodiments of the present disclosure are described below in detail with reference to the drawings. It should be noted that, unless otherwise stated, the relative arrangement of components and steps, numeric expressions and values set forth in the embodiments are not intended to limit the scope of the present disclosure.

The following description for at least one exemplary embodiment is merely illustrative, and is not intended to limit the present disclosure, and application or usage of the present disclosure.

Technologies, methods and devices known by those skilled in the art may not be described in detail, but the technologies, methods and devices should be considered as a part of the specification when appropriate.

In all examples shown and discussed herein, any specific values should be construed as being merely illustrative rather than limitative. Therefore, a different value may be used in other examples of the exemplary embodiments.

It should be noted that similar reference numerals and letters indicate similar items in the drawings. Therefore, once an item is defined in one of the drawings, the item is no more discussed in the subsequent drawings.

Figure 2:
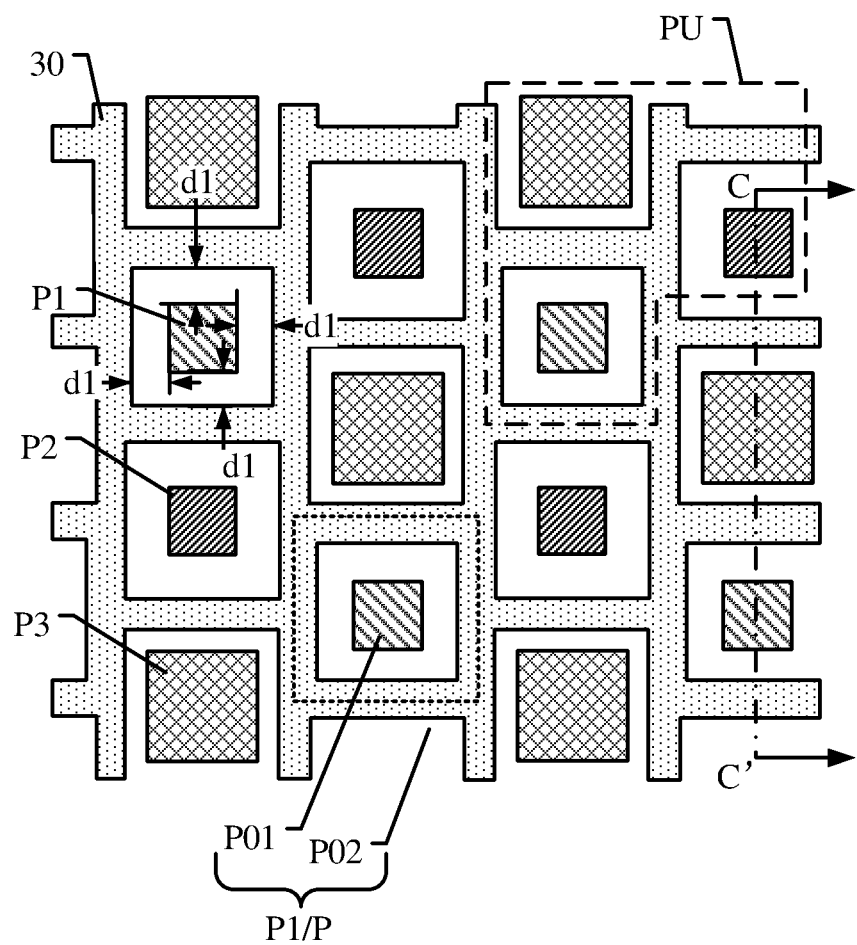
FIG. 2 is a schematic enlarged structural diagram of the region a in FIG. 1.
Figure 3:
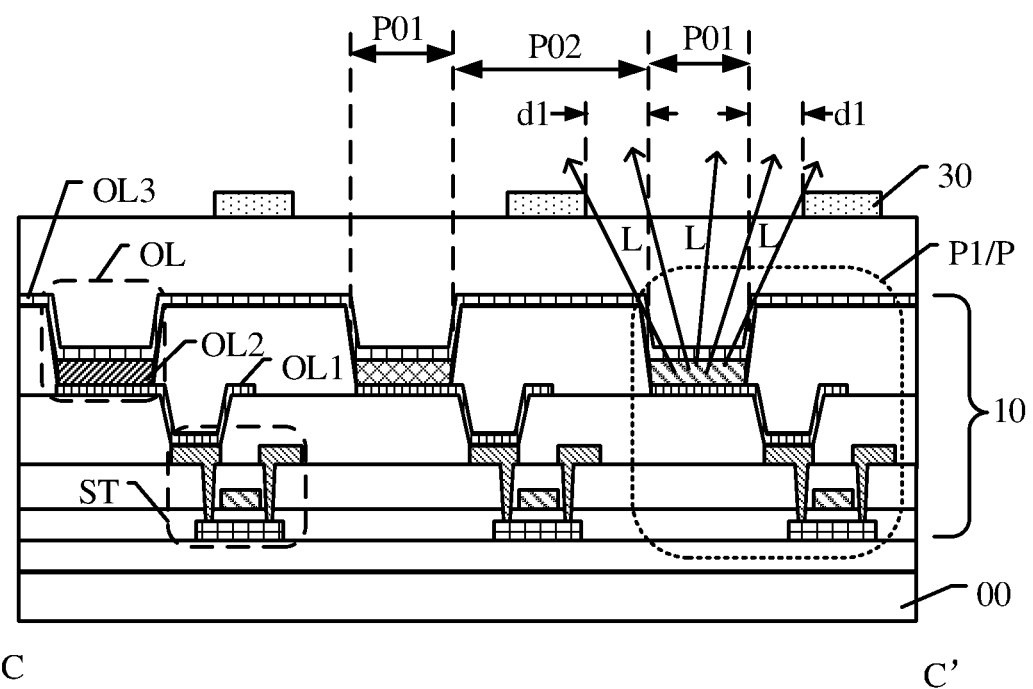
FIG. 3 is a schematic cross-sectional structural diagram taken along the line CC' in FIG. 2.

Reference is made to FIG. 1, FIG. 2 and FIG. 3. FIG. 1 is a schematic planar structural diagram of a touch display panel according to an embodiment of the present disclosure, FIG. 2 is a schematic enlarged structural diagram of the region a in FIG. 1, and FIG. 3 is a schematic cross-sectional structural diagram taken along the line CC' in FIG. 2. A touch display panel is provided according to the embodiment, which includes a substrate 00, a light-emitting device layer 10, and multiple touch electrodes 30.

The light-emitting device layer 10 is arranged on the substrate 00, and includes multiple pixels P. Each of the pixels P has a light-emitting region P01 and a non-light-emitting region P02 on the periphery of the light-emitting region P01.

The multiple touch electrodes 30 are arranged on a side of the light-emitting device layer 10 away from the substrate 00. Each of the touch electrodes 30 has a structure of a metal grid.

The pixels P include first color pixels P1. Grid lines of the metal grid are arranged in each of non-light-emitting regions P02 of at least a part of the first color pixels P1.

A first boundary distance of each of the first color pixels P1 is a distance between the boundary of the light-emitting region P01 of one first color pixel P1 and the touch electrode edge which is arranged in the non-light-emitting region P02 of the first color pixel P1 and is the closest to the boundary in a direction parallel to the substrate 00. The first boundary distance of the first color pixel P1 is equal to a fixed distance d1, where 1 μm≤d1≤20 μm.

In the touch display panel according to the embodiment, the substrate 00 may be a rigid glass substrate or a flexible plastic substrate, which is not limited in the embodiment.

The multiple touch electrodes 30 in the touch display panel are used to identify a touch operation. For example, the touch electrodes 30 may identify location information of the touch operation. The touch electrodes 30 are made of a metal material, which has good electrical conductivity but poor light transmittance. The touch electrode 30 is in a shape of a metal grid. The metal grid includes grid lines and a mesh. The grid lines are arranged only in the non-light-emitting region P02 and do not overlap with the light-emitting region P01, so as not to affect a light-emitting effect of the pixels P.

The touch electrode may operate in a self-capacitance mode or a mutual capacitance mode. In the embodiment, only the touch electrode 30 operating in the mutual capacitance mode is described as an example. The touch electrodes include multiple touch transmitting electrodes TX and multiple touch receiving electrodes RX.

The multiple pixels P in the light-emitting device layer 10 are used to display image information. The multiple pixels P may include the same color of pixels, or two or more colors of pixels. In the embodiment, only a case that the pixels P include three colors of pixels, i.e., first color pixels P1, second color pixels P2 and third color pixels P3 is described as an example.

In an embodiment, each of the pixels P may include a thin film transistor ST and an organic light-emitting diode OL. The organic light-emitting diode OL includes an anode OL1, a light-emitting material portion OL2, and a cathode OL3. The cathode OL3 is electrically connected with the thin film transistor ST.

Each of the pixels P has a light-emitting region P01 and a non-light-emitting region P02 arranged on the periphery of the light-emitting region P01. Light is emitted from the light-emitting region P01 to display image information, and no light is emitted from the non-light-emitting region P02 in an ideal case. It should be noted that the light-emitting region of the pixel may be a region where the light-emitting material portion OL2 is arranged, and the non-light-emitting region P02 of the pixel P may be provided with a structure such as the thin film transistor and wiring. There is no strict boundary in the non-light-emitting region P02 of the pixel P, and a region on the periphery of the light-emitting region P01 which does not emit light therefrom is the non-light-emitting region P02. Adjacent pixels P may share one non-light-emitting region P02.

The grid lines of the metal grid are arranged in each of the non-light-emitting regions P02 of at least a part of the first color pixels P1 of the multiple pixels P. In other words, the grid lines of the metal grid may be arranged in each of the non-light-emitting regions P02 of all or a part of the first color pixels P1.

In the direction parallel to the substrate 00, for the first color pixels P1 having the non-light-emitting regions P02 in each of which the grid lines of the metal grid are arranged, first boundary distances of the first color pixels are equal to a fixed value d1, where d1 ranges from 1 μm to 20 μm. For example, in the touch display panel according to the embodiment of the present disclosure, the first boundary distances of the first color pixels are equal to 4 μm. In another touch display panel according to the embodiment of the present disclosure, the first boundary distances of the first color pixels P1 are equal to 10 μm. That is, in the same touch display panel, d1 is a fixed value. It should be noted that FIG. 1 and FIG. 2 are top views obtained by viewing the display panel in a direction perpendicular to the substrate 00.

In the embodiment, only the rectangle-shaped light-emitting region P01 of the first color pixel P1 is described as an example. The light-emitting region P01 of the first color pixel P1 may also be in a circular shape, a diamond shape or other shapes. The distance between a boundary of a light-emitting region P01 and the edge of a metal grid refers to the shortest distance between a boundary of the light-emitting region P01 and the grid line of the metal grid in a plane parallel to the substrate 00.

Referring to FIG. 3, in the touch display panel according to the embodiment, the light-emitting regions P01 of all the first color pixels P1 may be set to have the same shape and size, to achieve a uniform display effect. However, since light from one first color pixel P1 emits externally in multiple directions besides a direction perpendicular to the substrate 00, a part light L of the light emitted from the light-emitting region P01 of the first color pixel P1 is blocked by the edge of the metal grid of the touch electrode 30. In this case, when a person looks at the touch display panel, a light-emitting region of the first color pixel P1 which can be seen by the person is slightly larger than an actual light-emitting region P01.

In a case that the first boundary distances of the first color pixels P1 are different, the as-seen light-emitting regions of the first color pixels P1 may have different sizes when a person looks at the display panel in different directions, which results in a difference in a display screen and color shift.

Therefore, in the embodiment, each of the first boundary distances of the first color pixels P1 is set to be d1, so that the seen light-emitting regions of the first color pixels P1 may have the same size when a person looks at the display panel in different directions, thereby reducing a difference in a display screen, suppressing color shift, and improving a display effect. d1 should not be a too small value. If d1 is less than 1 µm, the boundary of the light-emitting region P01 is too close to the edge of the metal grid. In this case, a part of light emitted by the first color pixel P1 is blocked by the touch electrode, which reduces an aperture ratio of the touch display panel. In addition, d1 should not be a too large value. If d1 is greater than 20 µm, an area of the non-light-emitting region P02 is too large, which reduces the aperture ratio of the touch display panel. d1 ranges from 1 µm to 20 µm, which can improve the aperture ratio of the touch display panel.

Figure 4:
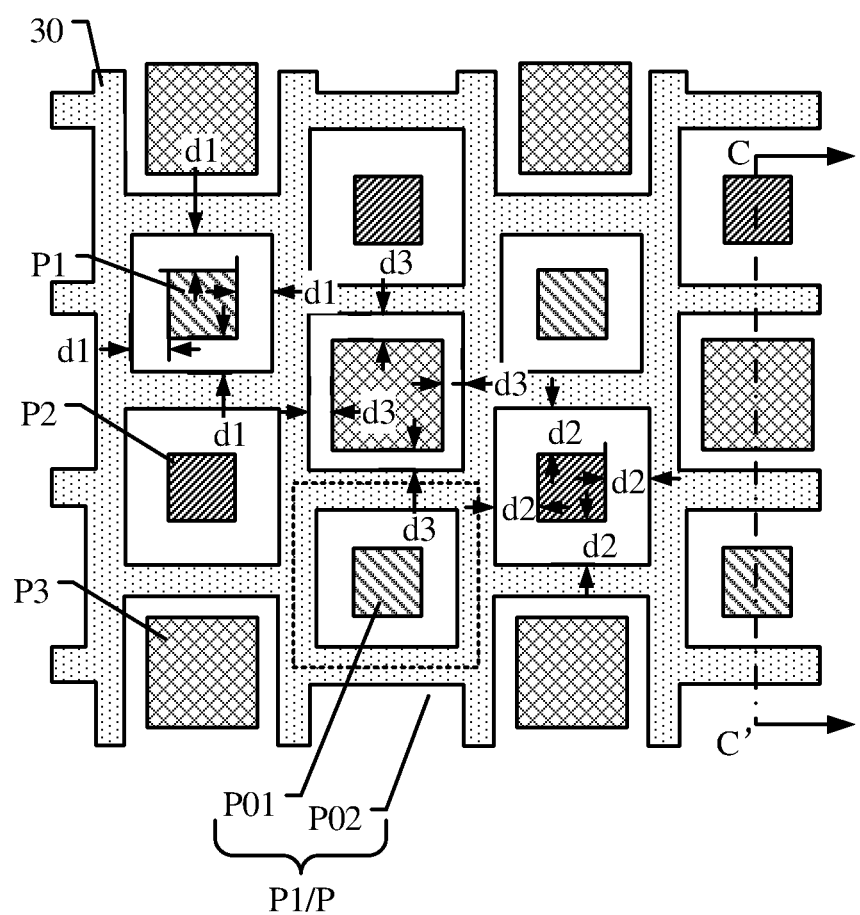
FIG. 4 is a schematic partial planar structural diagram of a touch display panel according to another embodiment of the present disclosure.

In some embodiments, reference is made to FIG. 4, which is a schematic partial planar structural diagram of a touch display panel according to another embodiment of the present disclosure. The pixels P include second color pixels P2. Grid lines of the metal grid are arranged in each of non-light-emitting regions P02 of at least a part of the second color pixels P2.

The distance d2 between a boundary of the light-emitting region of the second color pixel P2 and an edge of a close-by touch electrode is defined as the second boundary distance d2 of the second color pixel, here 1 µm≤d2≤20 µm.

In the touch display panel according to the embodiment, the grid lines of the metal grid are arranged in each of the non-light-emitting regions P02 of at least a part of the second color pixels P2 of the multiple pixels P. In other words, the grid lines of the metal grid may be arranged in each of the non-light-emitting regions P02 of all or a part of the second color pixels P2.

In the direction parallel to the substrate 00, for the second color pixels P2 having the non-light-emitting regions P02 in each of which the grid lines of the metal grid are arranged, the second boundary distances of the second color pixels P2 are equal to a fixed value d2, where d2 ranges from 1 µm to 20 µm. It should be noted that FIG. 4 is a top view of the display panel viewed in a direction perpendicular to the substrate 00.

In the embodiment, only the rectangle-shaped light-emitting region P01 of the second color pixel P2 is described as an example. The light-emitting region P01 of the second color pixel P2 may also be in a circle shape, a diamond shape or other irregular shape.

In this embodiment, each of the second boundary distances of the second color pixels P2 is set to be d2, so that the seen light-emitting regions of the second color pixels P2 may have the same size when a person looks at the display panel in different directions, thereby reducing the difference in a display effect, suppressing the color shift, and improving the display effect. d2 ranges from 1 µm to 20 µm, which can improve the aperture ratio of the touch display panel.

In some embodiments, reference is made again to FIG. 4. The pixels P include third color pixels P3. Grid lines of the metal grid are arranged in each of the non-light-emitting regions P02 of at least a part of the third color pixels P3.

A third boundary distance of each of the third color pixels P3 is a distance between a boundary of the light-emitting region P01 of the third color pixel P3 and the grid line which is arranged in the non-light-emitting region P02 of the third color pixel P3 and is closest to the boundary in a direction parallel to the substrate 00. The third boundary distances of the third color pixels P3 are all equal to a fixed distance d3, where 1 µm≤d3≤20 µm.

In the touch display panel according to the embodiment, the grid lines of the metal grid are arranged in each of the non-light-emitting regions P02 of at least a part of the third color pixels P3 of the multiple pixels P. In other words, the grid lines of the metal grid may be arranged in each of the non-light-emitting regions P02 of all or a part of the third color pixels P3.

In the direction parallel to the substrate 00, for the third color pixels P3 having the non-light-emitting regions P02 in each of which the grid lines of the metal grid are arranged, the third boundary distances of the third color pixels P3 are equal to a fixed value d3, where d3 ranges from 1 µm to 20 µm. It should be noted that FIG. 4 is a top view of the display panel viewed in a direction perpendicular to the substrate 00.

In the embodiment, only the rectangle-shaped light-emitting region P01 of the third color pixel P3 is described as an example. The light-emitting region P01 of the third color pixel P3 may also be in a circle shape, a diamond shape or other irregular shape.

In the embodiment, each of the third boundary distances of the third color pixels P3 is set to be d3, so that the viewed light-emitting regions of the third color pixels P3 may have the same size when a person looks at the display panel in different directions, thereby reducing the difference in a display effect, suppressing the color shift, and improving the display effect. d3 ranges from 1 µm to 20 µm, which can improve the aperture ratio of the touch display panel.

It should be noted that, in the touch display panel according to the embodiment of the present disclosure, the first color pixel P1, the second color pixel P2 and the third color pixel P3 may be a red pixel, a green pixel and a blue pixel, respectively.

Figure 5:
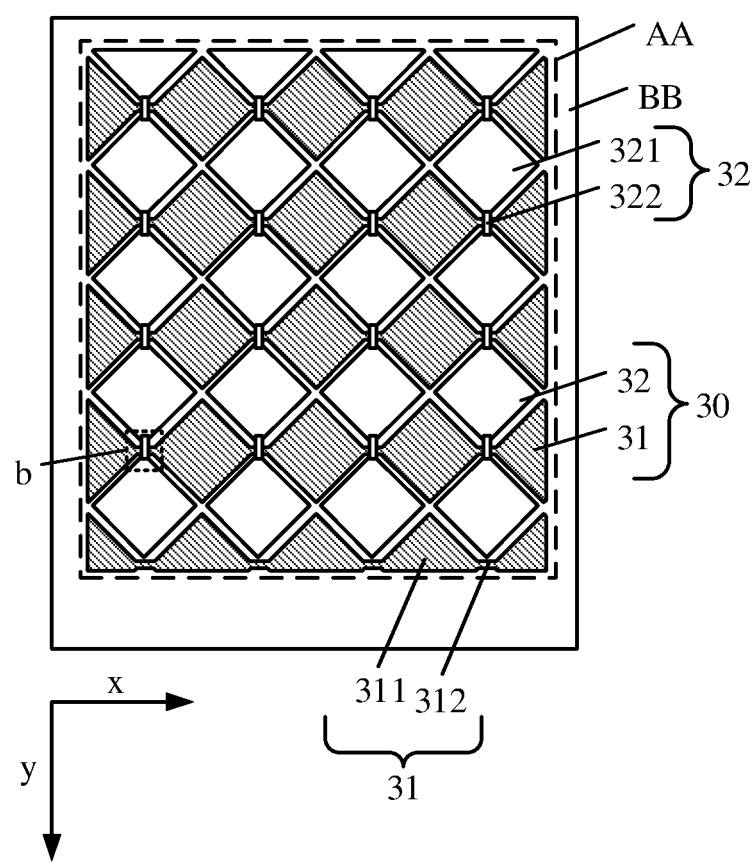
FIG. 5 is a schematic planar structural diagram of a touch display panel according to another embodiment of the present disclosure.
Figure 6:
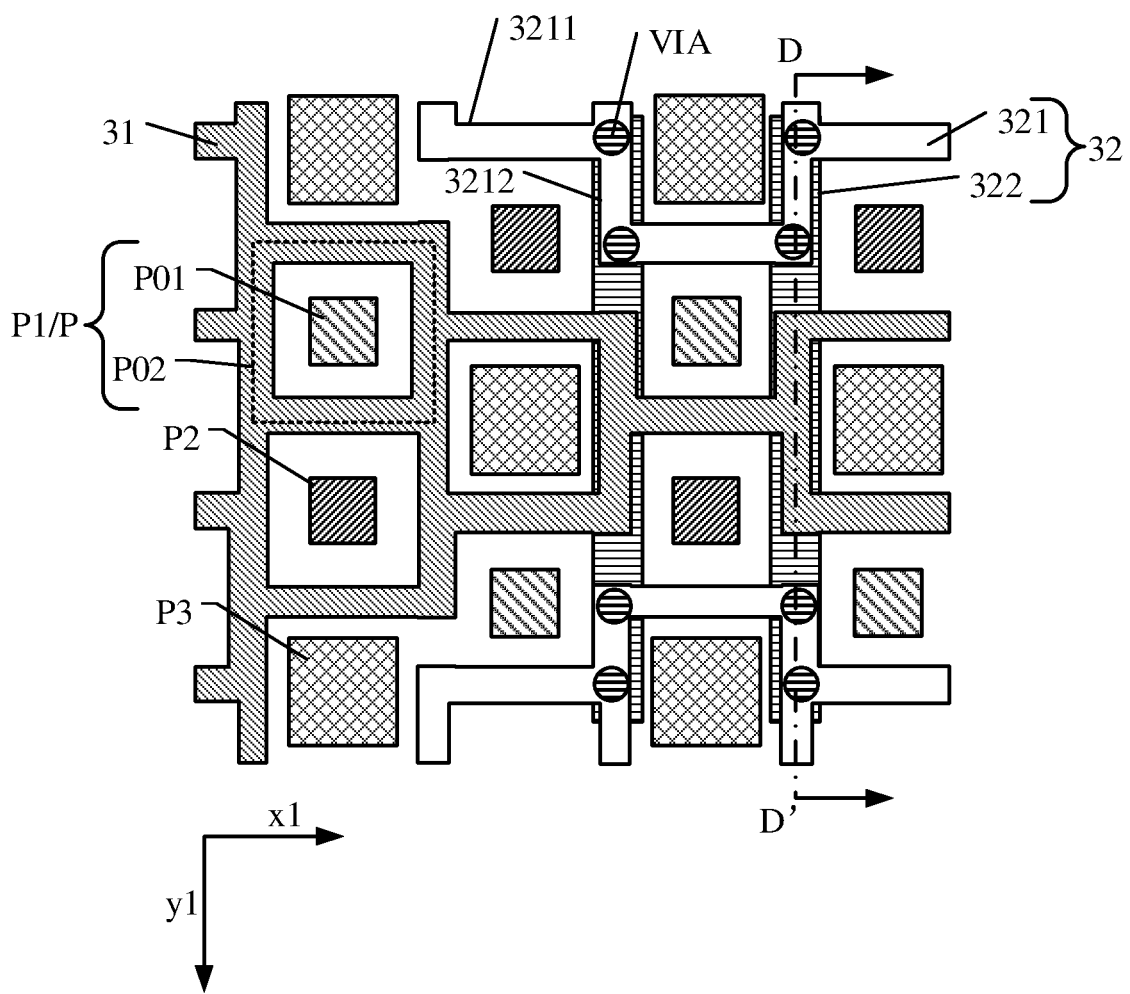
FIG. 6 is a schematic enlarged structural diagram of the region b in FIG. 5.
Figure 7:
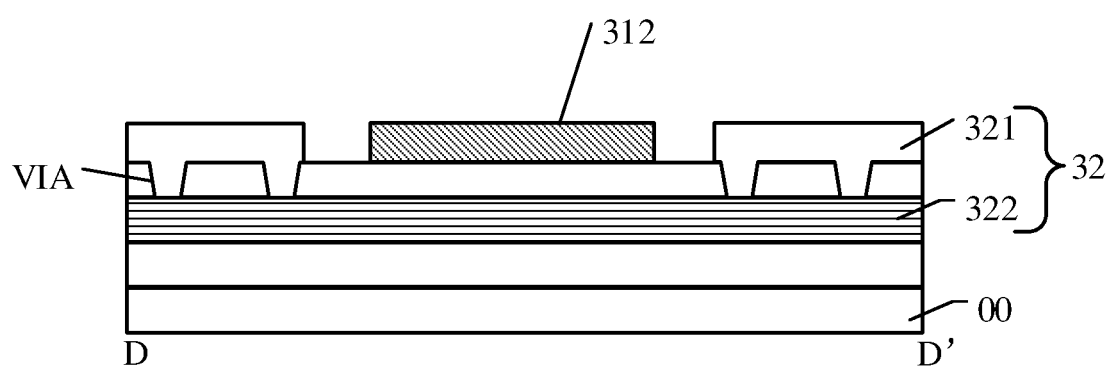
FIG. 7 is a schematic cross-sectional structural diagram taken along the line DD' in FIG. 6.

In some embodiments, reference is made to FIG. 5, FIG. 6, and FIG. 7. FIG. 5 is a schematic planar structural diagram of a touch display panel according to another embodiment of the present disclosure, FIG. 6 is a schematic enlarged structural diagram of a region b in FIG. 5, and FIG. 7 is a schematic cross-sectional structural diagram taken along a line DD' in FIG. 6. The touch electrodes 30 include multiple first electrodes 31 arranged in a second direction y and multiple second electrodes 32 arranged in a first direction x. Each of the first electrodes 31 extends in the first direction x, and each of the second electrodes 32 extends in the second direction y.

Each of the first electrodes 31 includes multiple first sub portions 311 arranged in the first direction x, and multiple first connection portions 312. Two adjacent first sub portions 311 are electrically connected with each other via the first connection portion 312.

Each of the second electrodes 32 includes multiple second sub portions 321 arranged in the second direction y. The touch display panel includes multiple cross-bridge portions 322. Two adjacent second sub portions 321 are electrically connected with each other via the cross-bridge portion 322.

The first sub portions 311, the first connection portions 312 and the second sub portions 321 are arranged in the same layer. The cross-bridge portions 322 are arranged in a different layer from the second sub portions 321. The cross-bridge portion 322 includes at least one metal wire.

It should be noted that the metal wire of the cross-bridge portion 322 may be designed with reference to the grid lines of the metal grid of the second sub portion 321. For example, the metal wire of the cross-bridge portion 322 may extend in the same direction as a part of the grid lines of the metal grid of the second sub portion 321.

In FIG. 6, only a case that the cross-bridge portion 322 includes two metal wires is described as an example. Alternatively, the cross-bridge portion 322 may include one, three or more metal wires, which is not limited in the embodiment.

In the touch display panel according to the embodiment, a shape of each of the first sub portion 311 and the second sub portion 321 is diamond. In a process of manufacturing the display panel, the first sub portions 311, the first connection portions 312, and the second sub portions 321 may be formed by patterning the same metal layer with a similar manufacturing process.

It should be noted that the touch electrode 30 operates in the mutual capacitance mode in the embodiment. The first electrode 31 may be a touch transmitting electrode, and the second electrode 32 may be a touch receiving electrode. Alternatively, the second electrode 32 may be a touch transmitting electrode, and the first electrode 31 may be a touch receiving electrode.

Figure 8:
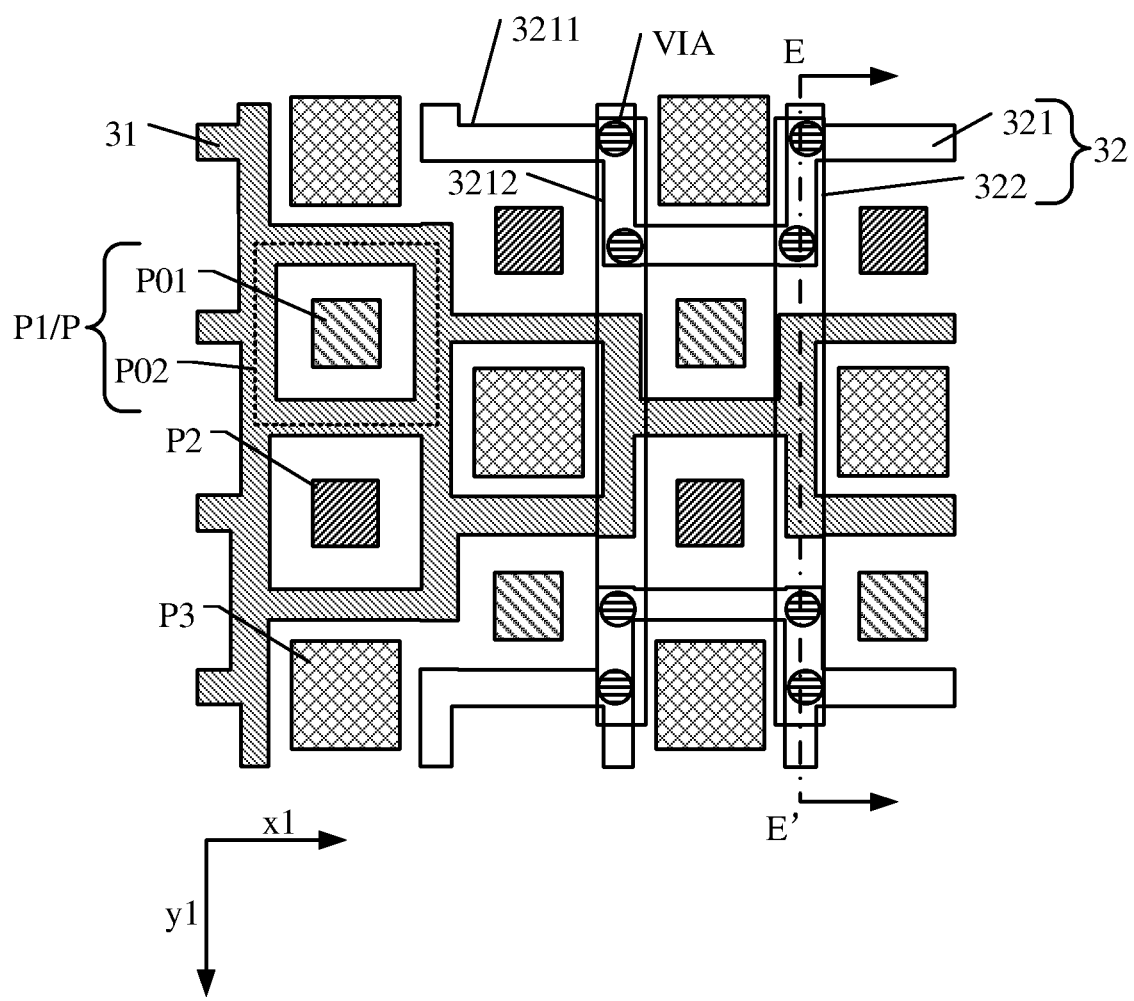
FIG. 8 is a schematic partial planar structural diagram of a touch display panel according to another embodiment of the present disclosure.
Figure 9:
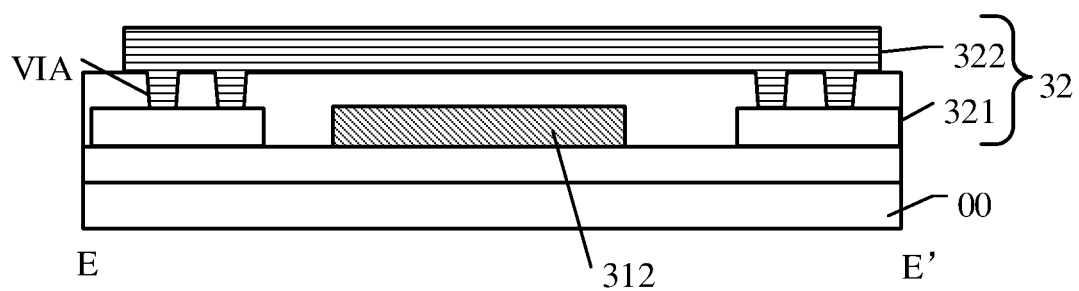
FIG. 9 is a schematic cross-sectional structural diagram taken along the line EE' in FIG. 8.

The cross-bridge portion 322 is arranged in a different layer from the second sub portion 321. There may be two relative position relationships between the cross-bridge portion and the second sub portion. Referring to FIG. 7, the cross-bridge portion 322 is arranged on a side of the second sub portion 321 close to the substrate 00. Alternatively, reference is made to FIG. 8 and FIG. 9. FIG. 8 is a schematic partial planar structural diagram of a touch display panel according to another embodiment of the present disclosure, and FIG. 9 is a schematic cross-sectional structural diagram taken along a line EE' in FIG. 8. In other embodiments of the present disclosure, the cross-bridge portion 322 may be arranged on a side of the second sub portion 321 away from the substrate 00. It should be noted that in order to clearly illustrate the technical solution in the embodiment, the cross-bridge portion 322 shown in FIG. 8 is not filled with a pattern and is shown as a line box.

In an embodiment, referring to FIG. 5, FIG. 6 and FIG. 7, each of the second sub portions 321 includes multiple first wiring portions 3211 and multiple second wiring portions 3212. Each of the first wiring portions 3211 extends in a third direction x1, and each of the second wiring portions 3212 extends in a fourth direction y1. The third direction x1 intersects with the fourth direction y1.

The cross-bridge portion 322 is electrically connected with the second sub portion 321 through one or more via holes VIA. At least one via hole VIA is arranged at a position where the first wiring portion 3211 intersects with the second wiring portion 3212.

In an embodiment, the third direction x1 is the same as the first direction x, and the fourth direction y1 is the same as the second direction y.

In the embodiment, the grid lines of the metal grid of the second sub portion 321 include multiple first wiring portions 3211 and multiple second wiring portions 3212. Each of the first wiring portions 3211 and the second wiring portions 3212 may be approximate to a line segment, and at least one via hole VIA is arranged at a position where the first wiring portion 3211 intersects with the second wiring portion 3212. Since a line width at the position where the first line portion 3211 intersects with the second wire portion 3212 is large, a sufficient space may be provided to arrange the via hole VIA, to improve reliability of an electrical connection between the cross-bridge portion 322 and the second sub portion 321, thereby improving the yield of the touch display panel and improving a display effect.

In an embodiment, referring to FIG. 5 and FIG. 6, the cross-bridge portion 322 is arranged as a straight line segment. In the touch display panel shown in FIG. 6, the cross-bridge portion 322 includes two metal wires extending in the fourth direction y1. In the embodiment, the length of the cross-bridge portion 322 arranged as the straight line segment is small, which reduces a resistance of the cross-bridge portion 322, and further reduces a resistance and a parasitic capacitance of the second electrode 32, and reduces a voltage of an electrical signal for driving the second electrode 32, thereby reducing power consumption of the display panel, and improving a display and touch effect.

In some embodiments, referring to FIGS. 5 and 6, the cross-bridge portion 322 extends across N pixels P. N is a positive integer, and $2 \leq N \leq 10$. In the embodiment, only a case that the cross-bridge portion 322 extends in the second direction y is described as an example. If a non-light-emitting region P02 of a pixel P includes a metal wire of a cross-bridge portion 322, the cross-bridge portion 322 is considered to extend across the pixel P. In the embodiment, the cross-bridge portion 322 extends across four pixels P in the second direction y. In an embodiment, the cross-bridge portion 322 may extend across two, three or five pixels P in the second direction y. It can be understood that, in a case that the PPI of the touch display panel is low, the size of the pixel P is large, and the number of pixels P across which the cross-bridge portion 322 extends is small. The number of pixels P is usually not less than two, since the cross-bridge portion 322 needs to cross the first connection portion 312, and a difficulty degree of structure design of the cross-bridge portion 322 is increased if the cross-bridge portion 322 extends across less than two pixels P. In addition, in a case that the PPI of the touch display panel is high, the size of the pixel P is small, and the number of pixels P across which the cross-bridge portion 322 extends is large. The number of pixels P is usually not more than ten. A too long cross-bridge portion 322 may result in a large resistance and a large parasitic capacitance, which is disadvantageous for reducing the power consumption of the display panel and improving the touch and display effect.

In an embodiment, referring to FIG. 5 and FIG. 6, one end of the metal wire of the cross-bridge portion 322 is electrically connected with one of two adjacent second sub portions 321 through one or two via holes, and the other end of the metal wire of the cross-bridge portion 322 is electrically connected with the other of the two adjacent second sub portions 321 through one or two via holes. In the embodiment, one end of the metal wire of the cross-bridge portion 322 may be electrically connected with the second sub portion 321 through one or two via holes, thereby improving reliability of the electrical connection between the cross-bridge portion 322 and the second sub portion 321 while reducing equivalent resistances of the cross-bridge portion 322 and the second sub portion 321.

Figure 10:
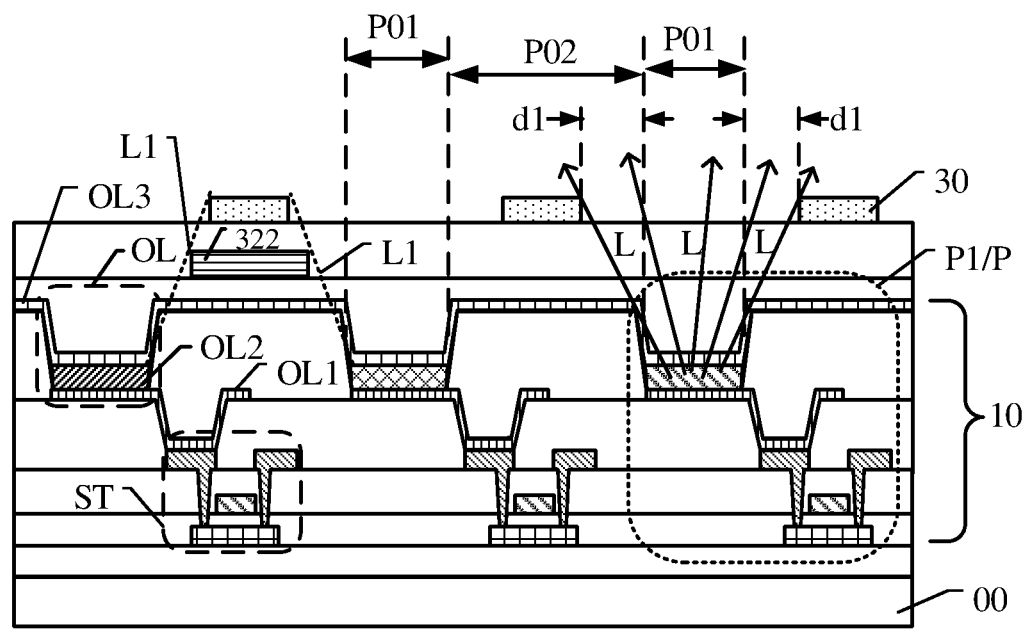
FIG. 10 is a schematic structural diagram of the first cross section of the touch display panel shown in FIG. 6.

In some embodiments, reference is made to FIG. 6 and FIG. 10. FIG. 10 is a schematic structural diagram of a first cross section of the touch display panel shown in FIG. 6. The first cross section is a cross section perpendicular to the substrate 00.

Each of the pixels includes an organic light-emitting diode OL. The organic light-emitting diode OL includes an anode OL1, a cathode OL3, and a light-emitting material portion OL2 clamped between the anode OL1 and the cathode OL3.

In the first cross section, a connection line between a vertex of the light-emitting material portion OL2 closest to the touch electrode 30 and a vertex of the touch electrode 30 closest to the light-emitting material portion OL2 is a first connection line L1, and an edge of the cross-bridge portion 322 is located on a side of the first connection line L1 away from the light-emitting material portion OL2.

In the embodiment, the first connection line L1 is a boundary. For light emitted by the light-emitting material portion OL2, a part of the light on one side of the first connection line L1 can be emitted from a light-emitting surface of the touch display panel, and a part of the light on the other side of the first connection line L1 is blocked by the touch electrode 30. Therefore, the edge of the cross-bridge portion 322 is located on the side of the first connection line L1 away from the light-emitting material portion OL2, to prevent the cross-bridge portion 322 from blocking the light emitted by the light-emitting material portion OL2. The cross-bridge portion 322 should not be too wide. In a too wide cross-bridge portion 322, an edge of the cross-bridge portion 322 towards the light-emitting material portion OL2 may go beyond the first connection line L1, which blocks the light emitted by the light-emitting material portion OL2, and reduces the aperture ratio of the touch display panel.

Figure 11:
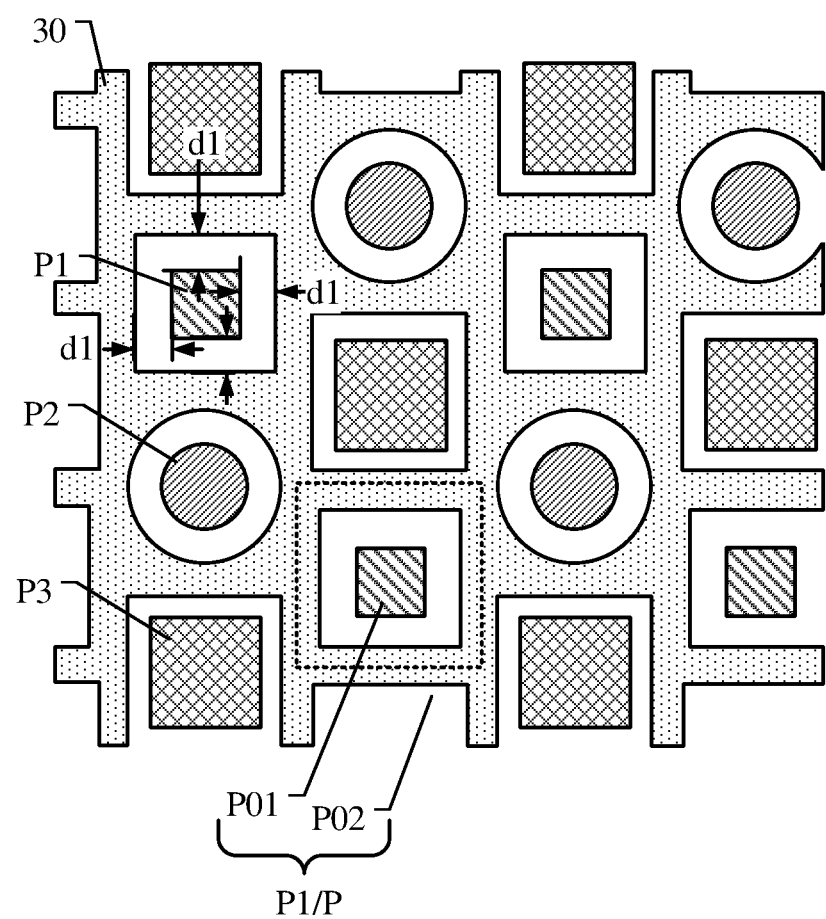
FIG. 11 is a schematic partial planar structural diagram of a touch display panel according to another embodiment of the present disclosure.

In the touch display panel shown in FIG. 2, FIG. 4 and FIG. 6, only the rectangle-shaped light-emitting region P01 of the pixel P is described as an example. In some embodiments, referring to FIG. 11, which is a schematic partial planar structural diagram of a touch display panel according to another embodiment of the present disclosure, light-emitting regions P01 of a part of pixels P such as pixels P2 may be circular. In an embodiment, the light-emitting regions P01 of the pixels P may be in one or more shapes of a triangle, a quadrangle, a pentagon and a hexagon, which may be set according to actual requirements of the touch display panel, and are not shown in the drawings in the embodiment one by one.

In some embodiments, referring to FIG. 2, the pixels P include three colors of pixel, i.e., red pixels, green pixels, and blue pixels. For example, the first color pixels P1 are the red pixels, the second color pixels P2 are the blue pixels, and the third color pixels P3 is the green pixels.

In an embodiment, still referring to FIG. 2, the touch display panel includes multiple pixel units PU. Each of the pixel units PU includes a red pixel, a green pixel, and a blue pixel. Connection lines for connecting the red pixel, the green pixel, and the blue pixel in the pixel unit PU constitute a triangle. In the embodiment, since the area of the pixel is quite small, the pixel may be regarded as a point. After the three pixels in the same pixel unit PU are connected, a triangle can be obtained. The pixel arrangement in a triangle facilitates pixel rendering, thereby improving the display effect of the display panel.

Figure 12:
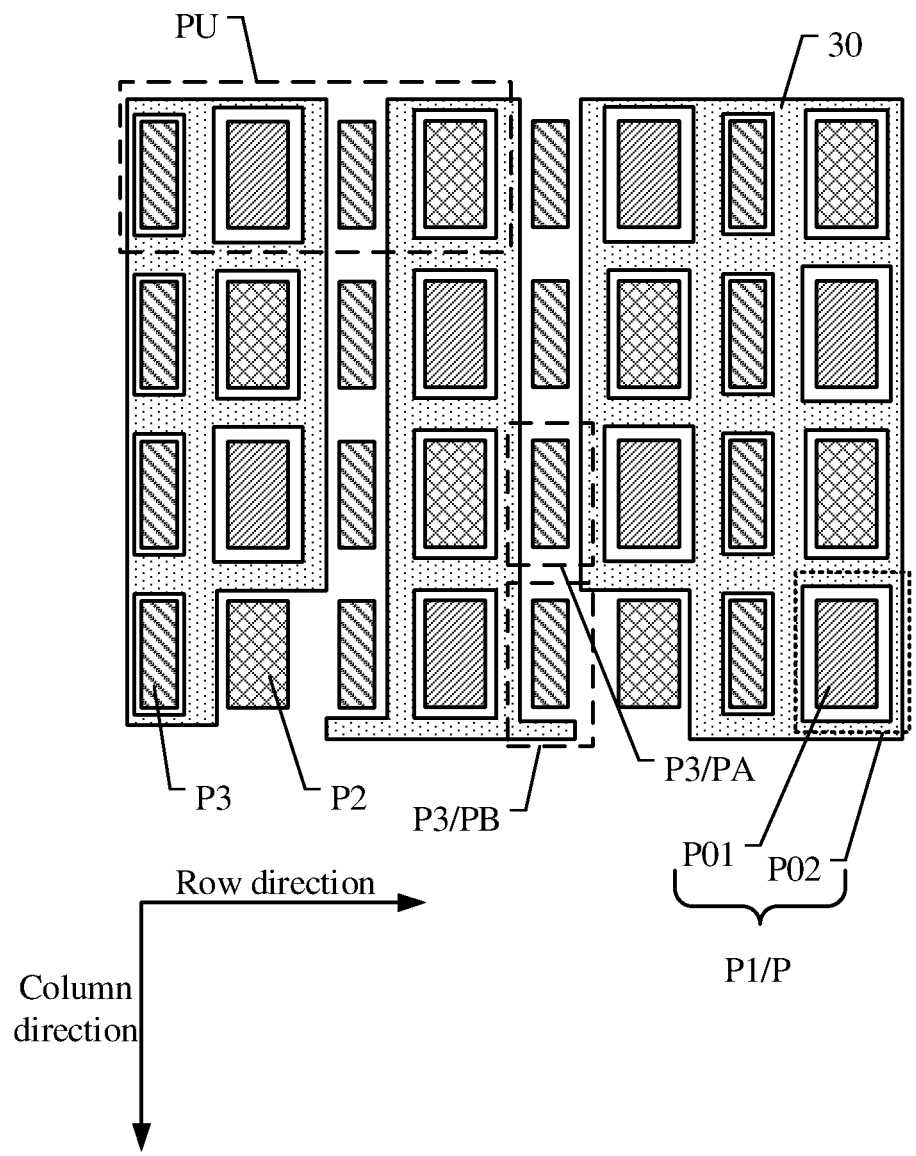
FIG. 12 is a schematic partial planar structural diagram of a touch display panel according to another embodiment of the present disclosure.

It should be noted that, in the touch display panel according to the embodiment of the present disclosure, the pixels may be arranged in various manners. For example, referring to FIG. 12, which is a schematic partial planar structural diagram of a touch display panel according to another embodiment of the present disclosure, multiple pixels P are arranged in a row direction and a column direction in the touch display panel shown in FIG. 12. Each of the pixels P has a light-emitting region P01 and a non-light-emitting region P02 on the periphery of the light-emitting region P01. A pixel unit PU may include four pixels, two pixels P3 of which have the same color. In an embodiment, the first color pixel P1 is a red pixel, the second color pixel P2 is a blue pixel, and the third color pixel P3 is a green pixels. In the column direction, the third color pixels P3 are arranged in a column, and the first color pixel P1 and the second color pixel P2 are alternately arranged in another column. In the touch display panel according to the embodiment, the pixels are arranged in another manner. In an embodiment, in the touch display panel, the grid lines of the touch electrode 30 may be arranged in the non-light-emitting region P02 of the pixel P in various manners, and are arranged according to specific design situations of the touch display panel. For example, the grid lines of the touch electrode 30 may be arranged around the light-emitting region P01 of a part of pixels P, or on two opposite sides of the light-emitting region P01 of a part of pixels PA, or on two adjacent sides of the light-emitting region P01 of a part of pixels PB, which are not described repeatedly in the embodiment.

Figure 13:
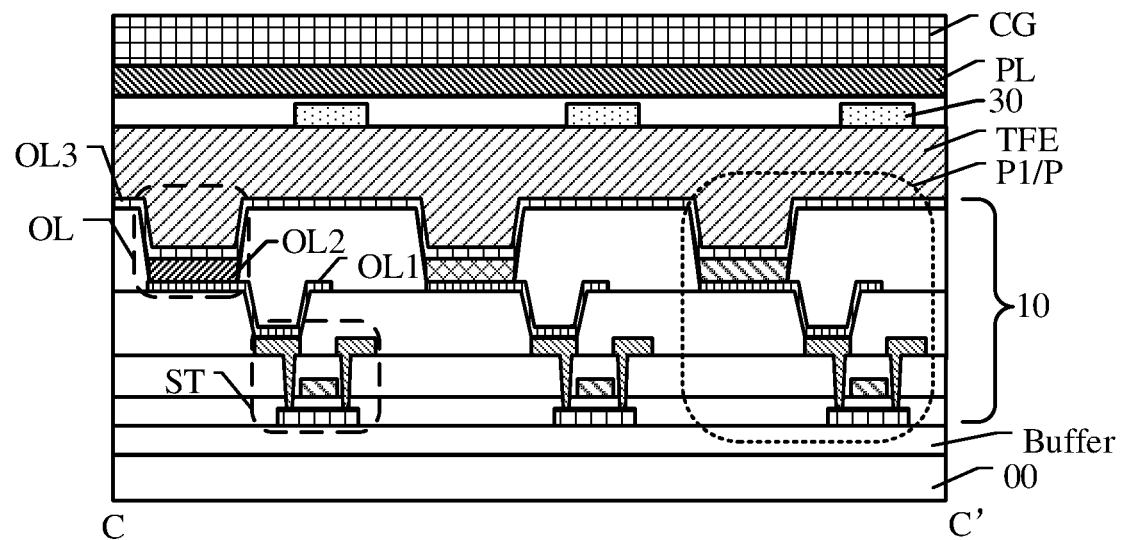
FIG. 13 is a schematic partial cross-sectional structural diagram of a touch display panel according to another embodiment of the present disclosure.

In some embodiments, reference is made to FIG. 13, which is a schematic partial cross-sectional structural diagram of a touch display panel according to another embodiment of the present disclosure. The substrate 00 is a flexible substrate. For example, the substrate 00 may be made of a resin material, so that the touch display panel is bendable so it maybe curved. In an embodiment, a buffer layer Buffer is arranged between the substrate 00 and the thin film transistor ST. The buffer layer Buffer has a function of blocking impurities, moisture and oxygen, and thus can protect the thin film transistor ST, the organic light-emitting diode OL and other structures in the touch display panel.

In an embodiment, the touch display panel includes a thin film encapsulation layer TFE covering the light-emitting device layer 10. The touch electrodes 30 are arranged on a surface of a side of the thin film encapsulation layer TFE away from the substrate 00. In the embodiment, the thin film encapsulation layer TFE may include three layers, i.e., two inorganic layers, and an organic layer clamped between the two inorganic layers. The thin film encapsulation layer TFE has a good sealing effect, and thus can prevent moisture, oxygen, and impurities in the air from entering the touch display panel. The thin film encapsulation layer TFE is also bendable so maybe curved.

In an embodiment, the touch display panel further includes a polarizing plate PL and a cover plate CG The polarizing plate PL is arranged on a side of the touch electrode 30 away from the substrate 00. The cover plate CG is arranged on a side of the polarizing plate PL away from the substrate 00. In the embodiment, the polarizing plate PL may be elliptical, which can reduce reflection of the touch display panel and improve the display effect. The cover plate CG is used to protect an internal structure of the touch display panel, and may be made of transparent glass or a resin material. In an embodiment, in a case that the touch display panel has a curved surface, the cover plate CG may be curved to match with the touch display panel.

A touch display device is further provided in the present disclosure. The touch display device includes the touch display panel provided in the present disclosure.

Figure 14:
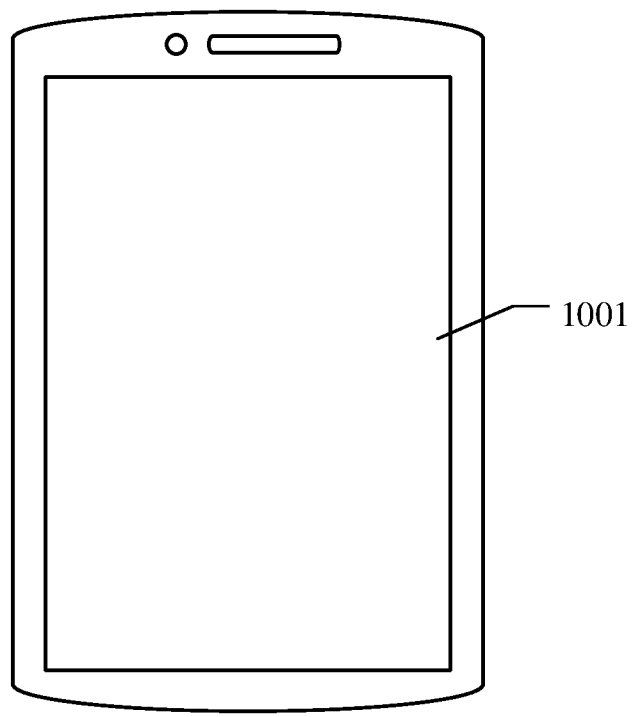
FIG. 14 is a schematic structural diagram of a touch display device according to an embodiment of the present disclosure.

Reference is made to FIG. 14, which is a schematic structural diagram of a touch display device according to an embodiment of the present disclosure. The touch display device 1000 shown in FIG. 14 includes the touch display panel 1001 according to any one of the above embodiments of the present disclosure. In the embodiment shown in FIG. 14, the touch display device 1000 is described by taking a mobile phone as an example. It can be understood that the touch display device according to the embodiment of the present disclosure may be a computer, a television, an in-vehicle display device and other touch display device having a display function, which is not limited in the present disclosure. The touch display device according to the embodiment of the present disclosure has the advantageous effects of the touch display panel according to the embodiments of the present disclosure, which may refer to the detailed description for the touch display panel according to the above embodiments, and is not described repeatedly herein.

It can be known from the above embodiments that, the touch display panel and the touch display device in the present disclosure have at least the following advantageous effects.

The first boundary distances of the first color pixels are set to be equal with each other, so that the seen light-emitting regions of the first color pixels have the same size when a person looks at the display panel in different directions, thereby reducing a difference in the display screen, suppressing color shift, solving a problem of a visible touch pattern in the touch display panel, and improving a display effect. Further, in the touch display panel and the touch display device in the present disclosure, the touch display panel can have a high aperture ratio, thereby improving resolution of the display panel, and achieving high PPI of the product and improving user experience.

Although some specific embodiments of the present disclosure have been described in detail by examples, it should be understood by those skilled in the art that, the above examples are used for illustration rather than for limiting the scope of the present disclosure. It should be understood by those skilled in the art that modification can be made to the above embodiments without departing from the scope and spirit of the present disclosure. The scope of the present disclosure is defined by the appended claims.

What is claimed is:

1. A touch display panel, comprising:
a substrate;
a light-emitting device layer arranged on the substrate, wherein the light-emitting device layer comprises a plurality of pixels, wherein each of the plurality of pixels has a light-emitting region and a non-light-emitting region at the periphery of the light-emitting region; and
a plurality of touch electrodes arranged on a side of the light-emitting device layer away from the substrate, wherein each of the plurality of touch electrodes has a structure of a metal grid,
wherein the plurality of pixels comprise a first color pixel, and grid lines of the metal grid are arranged in each of the non-light-emitting regions of at least a part of the first color pixel, and
a distance between any position at a boundary of the light-emitting region of the first color pixel and the grid line which is arranged in the non-light-emitting region of the first color pixel and is closest to the position at the boundary in a direction parallel to the substrate is referred as a first boundary distance of the first color pixel, and for all positions at the boundary of the light-emitting region of the first color pixel, the first boundary distance is equal to a fixed distance $d1$, wherein $1\ \mu m \leq d1 \leq 20\ \mu m$.

2. The touch display panel according to claim 1, wherein the plurality of pixels comprise a second color pixel, and grid lines of the metal grid are arranged in each of the non-light-emitting regions of at least a part of the second color pixel, and
a distance between any position at a boundary of the light-emitting region of the second color pixel and the grid line which is arranged in the non-light-emitting region of the second color pixel and is closest to the position at the boundary in the direction parallel to the substrate is referred as a second boundary distance of the second color pixel, and
for all positions at the boundary of the light-emitting region of the second color pixel, the second boundary distance is equal to a fixed distance $d2$, wherein $1\ \mu m \leq d2 \leq 20\ \mu m$.

3. The touch display panel according to claim 2, wherein the plurality of pixels comprise a third color pixel, and grid lines of the metal grid are arranged in each of the non-light-emitting regions of at least a part of the third color pixel, and
a distance between any position at a boundary of the light-emitting region of the third color pixel and the grid line which is arranged in the non-light-emitting region of the third color pixel and is closest to the position at the boundary in the direction parallel to the substrate is referred as a third boundary distance of the third color pixel, and
for all positions at the boundary of the light-emitting region of the third color pixel, the third boundary distance is equal to a fixed distance $d3$, wherein $1\ \mu m \leq d3 - 20\ \mu m$.

4. The touch display panel according to claim 1, wherein the plurality of touch electrodes comprises:
a plurality of first electrodes arranged in a second direction, wherein each of the plurality of first electrodes extends in a first direction; and
a plurality of second electrodes arranged in the first direction, wherein each of the plurality of second electrodes extends in the second direction,
wherein each of the plurality of first electrodes comprises a plurality of first sub portions arranged in the first direction and a plurality of first connection portions, and two adjacent first sub portions of the plurality of first sub portions are electrically connected with each other via one of the plurality of first connection portions; and
each of the plurality of second electrodes comprises a plurality of second sub portions arranged in the second direction,
wherein the touch display panel comprises a plurality of cross-bridge portions, and two adjacent second sub portions of the plurality of second sub portions are electrically connected with each other via one of the plurality of cross-bridge portions, and
the plurality of first sub portions, the plurality of first connection portions and the plurality of second sub portions are arranged in a same layer, the plurality of cross-bridge portions are arranged in a different layer from the plurality of second sub portions, and each of the plurality of cross-bridge portions comprises at least one metal wire.

5. The touch display panel according to claim 4, wherein
the plurality of cross-bridge portions are arranged on a side of the plurality of second sub portion close to the substrate; or
the plurality of cross-bridge portions are arranged on a side of the plurality of second sub portions away from the substrate.

6. The touch display panel according to claim 4, wherein
each of the plurality of pixels comprises an organic light-emitting diode, and the organic light-emitting diode comprises an anode, a cathode, and a light-emitting material portion clamped between the anode and the cathode; and
in a first cross section of the touch display panel perpendicular to the substrate, a connection line between a vertex of the light-emitting material portion closest to the touch electrode and a vertex of the touch electrode closest to the light-emitting material portion is a first connection line, and an edge of each of the plurality of cross-bridge portions is located on a side of the first connection line away from the light-emitting material portion.

7. The touch display panel according to claim 4, wherein
each of the plurality of second sub portions comprises a plurality of first wiring portions and a plurality of second wiring portions, each of the first wiring portions extends in a third direction, and each of the second wiring portions extends in a fourth direction, and the third direction intersects with the fourth direction; and
each of the plurality of cross-bridge portions are electrically connected with one of the plurality of second sub portions through one or more via holes, and at least one of the one or more via holes is arranged at a position where the first wiring portion intersects with the second wiring portion.

8. The touch display panel according to claim 7, wherein
for each of the at least one metal wire of each of the plurality of cross-bridge portions, one end of the metal wire is electrically connected with one of the two adjacent second sub portions through one or two of the via holes, and the other end of the metal wire is electrically connected with the other of the two adjacent second sub portions through one or two of the one or more via holes.

9. The touch display panel according to claim 4, wherein each of the plurality of cross-bridge portions is arranged as a straight line segment.

10. The touch display panel according to claim 4, wherein each of the plurality of cross-bridge portions extends across N pixels of the plurality of pixels, wherein N is a positive integer, and $2 \leq N \leq 10$.

11. The touch display panel according to claim 1, wherein the light-emitting regions of the plurality of pixels are in one or more shapes of a circle, a triangle, a quadrangle, a pentagon and a hexagon.

12. The touch display panel according to claim 1, wherein the plurality of pixels comprise red pixels, green pixels and blue pixels.

13. The touch display panel according to claim 11, comprising:
a plurality of pixel units, wherein each of the plurality of pixel units comprises a red pixels, a green pixel and a blue pixel,
wherein connection lines for connecting the red pixel, the green pixel and the blue pixel in the pixel unit constitute a triangle.

14. The touch display panel according to claim 1, wherein the substrate is a flexible substrate.

15. The touch display panel according to claim 1, further comprising:
a thin film encapsulation layer covering the light-emitting device layer,
wherein the plurality of touch electrodes are arranged on a surface of a side of the thin film encapsulation layer away from the substrate.

16. The touch display panel according to claim 15, further comprising:
a polarizing plate arranged on a side of the plurality of touch electrodes away from the substrate; and
a cover plate arranged on a side of the polarizing plate away from the substrate.

17. A touch display device, comprising a touch display panel, wherein the touch display panel comprises:
a substrate;
a light-emitting device layer arranged on the substrate, wherein the light-emitting device layer comprises a plurality of pixels, and each of the plurality of pixels has a light-emitting region and a non-light-emitting region at the periphery of the light-emitting region; and
a plurality of touch electrodes arranged on a side of the light-emitting device layer away from the substrate, wherein each of the plurality of touch electrodes has a structure of a metal grid,
wherein the plurality of pixels comprise a first color pixel, and grid lines of the metal grid are arranged in each of the non-light-emitting regions of at least a part of the first color pixel, and
a distance between any position at a boundary of the light-emitting region of the first color pixel and the grid line which is arranged in the non-light-emitting region of the first color pixel and is closest to the position at the boundary in a direction parallel to the substrate is referred as a first boundary distance of the first color pixel, and
for all positions at the boundary of the light-emitting region of the first color pixel, the first boundary distance is equal to a fixed distance d1, wherein $1 \mu m \leq d1 \leq 20 \mu m$.

18. The touch display device according to claim 17, wherein
the plurality of pixels comprise a second color pixel, and grid lines of the metal grid are arranged in each of the non-light-emitting regions of at least a part of the second color pixel, and
a distance between a boundary of the light-emitting region of the second color pixel and the grid line which is arranged in the non-light-emitting region of the second color pixel and is closest to the position at the boundary in the direction parallel to the substrate is referred as a second boundary distance of the second color pixel, and
for all positions at the boundary of the light-emitting region of the second color pixel, the second boundary distance is equal to a fixed distance d2, wherein $1 \mu m \leq d2 \leq 20 \mu m$.

19. The touch display device according to claim 18, wherein
the plurality of pixels comprise a third color pixel, and grid lines of the metal grid are arranged in each of the non-light-emitting regions of at least a part of the third color pixel, and
a distance between a boundary of the light-emitting region of the third color pixel and the grid line which is arranged in the non-light-emitting region of the third color pixel and is closest to the position at the boundary in the direction parallel to the substrate is referred as a third boundary distance of the third color pixel, and for all positions at the boundary of the light-emitting region of the third color pixel, the third boundary distance-is equal to a fixed distance d3, wherein 1 µm≤d3≤20 µm.

20. The touch display device according to claim 17, wherein the plurality of touch electrodes comprises:
   a plurality of first electrodes arranged in a second direction, wherein each of the plurality of first electrodes extends in a first direction; and
   a plurality of second electrodes arranged in the first direction, wherein each of the plurality of second electrodes extends in the second direction,
   wherein each of the plurality of first electrodes comprises a plurality of first sub portions arranged in the first direction and a plurality of first connection portions, and two adjacent first sub portions of the plurality of first sub portions are electrically connected with each other via one of the plurality of first connection portions; and
   each of the plurality of second electrodes comprises a plurality of second sub portions arranged in the second direction,
   wherein the touch display panel comprises a plurality of cross-bridge portions, and two adjacent second sub portions of the plurality of second sub portions are electrically connected with each other via one of the plurality of cross-bridge portions, and
   the plurality of first sub portions, the plurality of first connection portions and the plurality of second sub portions are arranged in a same layer, the plurality of cross-bridge portions are arranged in a different layer from the plurality of second sub portions, and each of the plurality of cross-bridge portions comprises at least one metal wire.

* * * * *